(12) United States Patent
Koo

(10) Patent No.: US 8,716,833 B2
(45) Date of Patent: May 6, 2014

(54) SEMICONDUCTOR DEVICES AND METHODS OF MANUFACTURING THE SAME

(75) Inventor: Tae-woong Koo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/603,478

(22) Filed: Sep. 5, 2012

(65) Prior Publication Data

US 2013/0127012 A1 May 23, 2013

(30) Foreign Application Priority Data

Nov. 23, 2011 (KR) .................. 10-2011-0123114

(51) Int. Cl.
*H01L 21/02* (2006.01)
(52) U.S. Cl.
USPC ........... 257/532; 257/295; 257/296; 257/301; 257/304; 257/306; 438/238; 438/239; 438/240; 438/243
(58) Field of Classification Search
CPC .................. H01L 29/66181; H01L 29/945
See application file for complete search history.

(56) References Cited

U.S. PATENT DOCUMENTS

| 6,479,343 B1 * | 11/2002 | Hwang et al. ............... 438/253 |
| 6,653,186 B2 | 11/2003 | Won et al. |
| 2005/0024812 A1 * | 2/2005 | Yokoi ...................... 361/306.3 |

FOREIGN PATENT DOCUMENTS

| KR | 1020100044033 A | 4/2010 |
| KR | 1020100074003 A | 7/2010 |

\* cited by examiner

*Primary Examiner* — Kyoung Lee
(74) *Attorney, Agent, or Firm* — Myers Bigel Sibley & Sajovec, P.A.

(57) ABSTRACT

A method of manufacturing a semiconductor device including forming on a substrate an insulating interlayer through which a capacitor contact is interposed; forming on the insulating interlayer a first upper electrode having an opening through which the capacitor contact is exposed; forming a first dielectric layer pattern on a lateral wall of the opening; forming a lower electrode on the first dielectric layer pattern formed in the opening and the capacitor contact; forming a second dielectric layer pattern on the lower electrode formed in the opening and the first dielectric layer pattern; and forming on the second dielectric layer pattern a second upper electrode so as to fill the opening and to contact the first upper electrode. The semiconductor device may prevent a lower electrode of a capacitor from collapsing.

19 Claims, 13 Drawing Sheets

SEMICONDUCTOR DEVICES AND METHODS OF MANUFACTURING THE SAME

CROSS-REFERENCE TO RELATED APPLICATION

This application claims the benefit under 35 U.S.C. §119 of Korean Patent Application No. 10-2011-0123114, filed on Nov. 23, 2011, in the Korean Intellectual Property Office, the disclosure of which is incorporated herein in its entirety by reference.

BACKGROUND

The inventive concept relates to semiconductor devices and to methods of manufacturing the same, and more particularly, to semiconductor devices that include capacitors and to methods of manufacturing such semiconductor devices.

As semiconductor devices such as, for example, dynamic random access memory (DRAM) devices become more highly integrated, the area occupied by the constituent elements of these devices is reduced, whereas the required capacitance is typically maintained or even increased. As a result, there is a need for technologies for effectively increasing capacitance within a limited area. Research has been conducted into a one cylinder storage (OCS)-type capacitor of which a lower electrode dimension is reduced, while a height of the lower electrode is increased to increase an effective electrode area. However, when the aspect ratio of the lower electrode is increased, the lower electrode may collapse during formation of the lower electrode.

SUMMARY

The inventive concept provides semiconductor devices that have capacitor lower electrodes that are less susceptible to collapsing, as well as methods of manufacturing such semiconductor devices.

According to an aspect of the inventive concept, there is provided a method of manufacturing a semiconductor device, the method including forming a first upper electrode on an insulating interlayer through which a capacitor contact is interposed, the first upper electrode having an opening that exposes the capacitor contact; forming a first dielectric layer pattern on an inner wall of the first upper electrode that at least partly defines the opening; forming a lower electrode on the first dielectric layer pattern and on the capacitor contact; forming a second dielectric layer pattern on the lower electrode and on the first dielectric layer pattern, where at least a portion of the second dielectric layer pattern is within the opening; and forming a second upper electrode on a portion of the second dielectric pattern that is within the opening and on the first upper electrode.

The first and second upper electrodes may be formed, for example, of doped polysilicon, silicon-germanium, metal, or metal nitride.

The first dielectric layer pattern may be formed by forming a first dielectric layer that at least partially fills the opening and anisotropically etching the first dielectric layer to form the first dielectric layer pattern on the inner wall of the first upper electrode.

The lower electrode may be formed by forming a lower electrode layer on the capacitor contact, the first dielectric layer pattern, and the first upper electrode, and then planarizing the lower electrode layer to expose upper surfaces of the first dielectric layer pattern and the first upper electrode to form the lower electrode directly on the capacitor contact and on the first dielectric layer pattern.

The second dielectric layer pattern may be formed by forming a second dielectric layer on the lower electrode, an upper surface of the first dielectric layer pattern, and the first upper electrode and then removing at least some of the portion of the second dielectric layer that is formed on the first upper electrode so as to expose portions of the upper surface of the first upper electrode.

According to another aspect of the inventive concept, there is provided a method of manufacturing a semiconductor device, the method including forming a layer on a substrate; forming a first upper electrode on the first layer; forming a plurality of openings in the first upper electrode; forming first dielectric layer patterns on sidewalls of the first upper electrode that are exposed through the openings; forming a plurality of lower electrodes within the openings on the first dielectric layer patterns; forming at least one second dielectric layer pattern on the lower electrodes formed in the openings, the first dielectric layer patterns, and a portion of the first upper electrode; and forming a second upper electrode on the first upper electrode and the second dielectric layer pattern, the second upper electrode being electrically connected to the first upper electrode.

The first layer may be an insulating interlayer through which a plurality of capacitor contacts are interposed, each of the openings may expose a respective one of the capacitor contacts, and the second upper electrode may extend into each of the openings.

The formation of the second dielectric layer pattern may include forming on the first upper electrode a second dielectric layer covering the lower electrodes in the openings; and forming a plurality of dielectric layer patterns that are respectively connected to the plurality of first dielectric layers by patterning the second dielectric layer.

A width of an upper surface of each of the plurality of second dielectric layer patterns may be substantially greater than a width of each of the openings formed in the first upper electrode.

Outlines of upper surfaces of the plurality of second dielectric layer patterns may have similar shapes to outlines of the openings.

Forming the at least one second dielectric layer pattern may include forming a second dielectric layer on the first upper electrode so as to cover the lower electrodes in the openings; and removing portions of the second dielectric layer on an edge portion of the first upper electrode to expose an upper surface of the edge portion of the first upper electrode.

The second upper electrode may be formed so as to contact the exposed portions of the edge portion of the first upper electrode.

The at least one second dielectric layer pattern may be formed by forming a second dielectric layer on the first upper electrode so as to cover inner walls of the openings; and forming a plurality of holes through the second dielectric layer that expose the first upper electrode. The plurality of lower electrodes may be spaced apart from each other in a first direction and in a second direction that is perpendicular to the first direction, and the plurality of holes may be respectively formed in regions between lower electrodes that are adjacent in a diagonal direction between the first direction and the second direction. The second upper electrode may directly contact portions of an upper surface of the first upper electrode that are exposed through the plurality of holes.

The method may further include forming an ohmic pattern on the first upper electrode prior to forming the second upper electrode so that the ohmic pattern is interposed between the first upper electrode and the second upper electrode.

Pursuant to further embodiments of the present inventive concept, semiconductor devices are provided that include a substrate and a capacitor that is on a top surface of the substrate. The capacitor may include a lower electrode that has a base and at least one sidewall that extends upwardly from the base, a first dielectric layer pattern that is on an outer surface of the at least one sidewall, and a second dielectric layer pattern that is on an upper surface of the base of the lower electrode and on an inner surface of the at least one sidewall. The capacitor further includes an upper electrode that directly contacts both the first dielectric layer pattern and the second dielectric layer pattern.

In some embodiments, the at least one sidewall may be a single, continuous sidewall that extends upwardly from an outer edge of the base of the lower electrode all the way around the periphery of the base of the lower electrode. By way of example, the lower electrode may have a cup-like shape and the single continuous sidewall may comprise a generally circular sidewall that extends upwardly from the base. The continuous sidewall of the lower electrode may have an inner surface and an outer surface that is opposite the inner surface, and the upper electrode may substantially surround both the inner surface and the outer surface of the continuous sidewall of the lower electrode.

In some embodiments, the upper electrode may comprise a first upper electrode that is on the first dielectric layer pattern and that surrounds the outer surface of the continuous sidewall of the lower electrode and a second upper electrode that is on the second dielectric layer pattern that together with the second dielectric layer pattern fills an interior region defined by an inner surface of the continuous sidewall of the lower electrode.

The second dielectric layer pattern may cover a top surface of the at least one sidewall of the lower electrode and may extend outwardly to further cover a top surface of a portion of the first dielectric layer pattern. In some embodiments, an upper surface of the second dielectric layer pattern may also extend onto a top surface of the first upper electrode so as to directly contact a portion of the top surface of the first upper electrode.

The semiconductor device may also include a transistor that is on the substrate and a contact that electrically connects to the transistor. In such embodiments, the base of the lower electrode may be on the contact.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
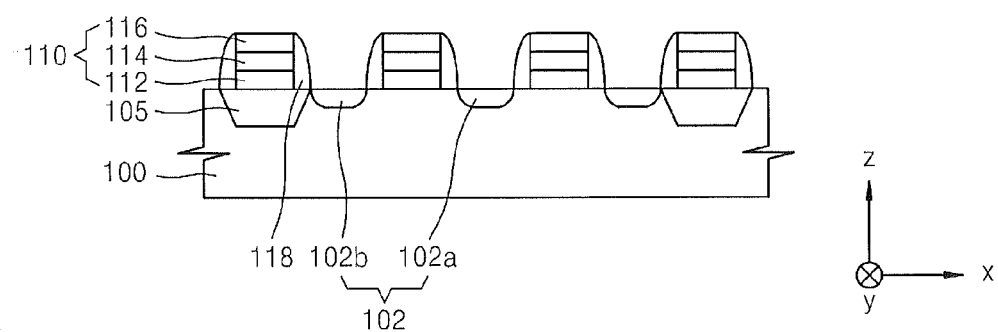
FIGS. 1 through 7 are cross-sectional views that illustrate a method of manufacturing a semiconductor device according to exemplary embodiments of the inventive concept.

The inventive concept will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. As used herein, the term "and/or" includes any and all combinations of one or more of the associated listed items.

FIGS. 1 through 7 are cross-sectional views that illustrate a method of manufacturing a semiconductor device according to exemplary embodiments of the inventive concept.

Referring to FIG. 1, an isolation layer 105 is formed in a substrate 100 and a plurality of gate structures 110 are formed on the substrate 100. The gate structures 110 may be spaced apart from each other in a first direction (the x-axis direction of FIG. 1) that is substantially parallel to an upper surface of the substrate 100, and may each extend in a second direction (the y-axis direction of FIG. 1) that is substantially perpendicular to the first direction. The substrate 100 may include a cell region and a peripheral region. For convenience of description, only the cell region is shown in FIG. 1.

The gate structures 110 may be formed by sequentially forming a gate insulating layer, a gate electrode layer, and a gate mask layer on the substrate 100 and then patterning the gate mask layer, the gate electrode layer, and the gate insulating layer by using, for example, a photolithography process. Thus, the gate structures 110 may each be formed to include a gate insulating layer pattern 112, a gate electrode 114, and a gate mask 116 that are sequentially stacked on the substrate 100.

A spacer layer may be formed to cover the gate structures 110 and then may be partially removed by using, for example, an anisotropic etching process to form spacers 118 on lateral sidewalls of the gate structures 110.

Then, impurity regions 102 are formed in upper portions of the substrate 100 that are adjacent the gate structures 110 by implanting impurities into the upper portions of the substrate 100 using the gate structures 110 and the spacers 118 as ion implantation masks. The impurity regions 102 may include first and second source/drain regions 102a and 102b.

Figure 2:
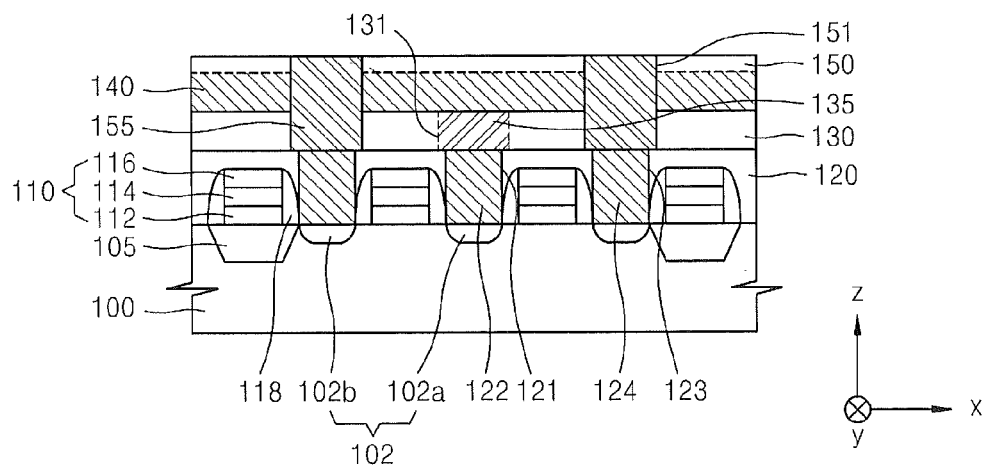

Referring to FIG. 2, a first insulating interlayer 120 is formed on the substrate 100 so as to cover the gate structures 110 and the spacers 118.

In exemplary embodiments, the first insulating interlayer 120 may be formed of silicon oxide, silicon nitride, silicon oxynitride, or the like by performing a chemical vapor deposition (CVD) process, an atomic layer deposition (ALD) process, a sputtering process, a spin coating process, or a combination thereof. For example, if the insulating interlayer is formed of silicon oxide, the silicon oxide may include borophosphosilicate glass (BPSG), tonen silazene (TOSZ), undoped silicate glass (USG), spin-on glass (SOG), flowable oxide (FOX), tetraethylortho silicate (TEOS), or high density plasma chemical vapor deposition (HDP-CVD) oxide.

First openings 121 and 123 are formed through the first insulating interlayer 120 to respectively expose the first and second source/drain regions 102a and 102b therethrough. A first conductive layer is formed on the substrate 100 and the first insulating interlayer 120 to fill and cover the first openings 121 and 123. The first conductive layer may be formed, for example, of doped polysilicon, metal, metal nitride, and/or metal silicide. The first conductive layer is planarized to expose an upper surface of the first insulating interlayer 120 to form first and second conductive plugs 122 and 124 that are electrically connected to the first and second source/drain regions 102a and 102b, respectively.

A second insulating interlayer 130 is formed on the first insulating interlayer 120 and the first and second conductive plugs 122 and 124. A second opening 131 is formed through the second insulating interlayer 130 to expose the first conductive plug 122 therethrough. A second conductive layer is formed on the substrate 100, the first conductive plug 122, and the second insulating interlayer 130 to fill the second opening 131. The second conductive layer may be formed of, for example, doped polysilicon, metal, metal nitride, and/or metal silicide. The second conductive layer is planarized to expose an upper surface of the second insulating interlayer 130 to form a bit line contact 135 that is electrically connected to the first conductive plug 122.

Then, a third conductive layer is formed on the second insulating interlayer 130 so as to contact the bit line contact 135 and is patterned to form a bit line 140 that is electrically connected to the bit line contact 135. The bit line 140 may extend in the first direction. The third conductive layer may formed of, for example, doped polysilicon, metal, metal nitride, and/or metal silicide.

A third insulating interlayer 150 is formed on the second insulating interlayer 130 so as to cover the bit line 140.

Then, third openings 151 are formed through the second and third insulating interlayers 130 and 150 to expose the second conductive plugs 124 therethrough. A fourth conductive layer is formed on the second conductive plugs 124 and the third insulating interlayer 150 so as to fill the third opening 151. The fourth conductive layer may be formed, for example, of doped polysilicon, metal, metal nitride, and/or metal silicide. The fourth conductive layer is planarized to expose an upper surface of the third insulating interlayer 150 to form capacitor contacts 155 that are electrically connected to the second conductive plugs 124.

Figure 3:
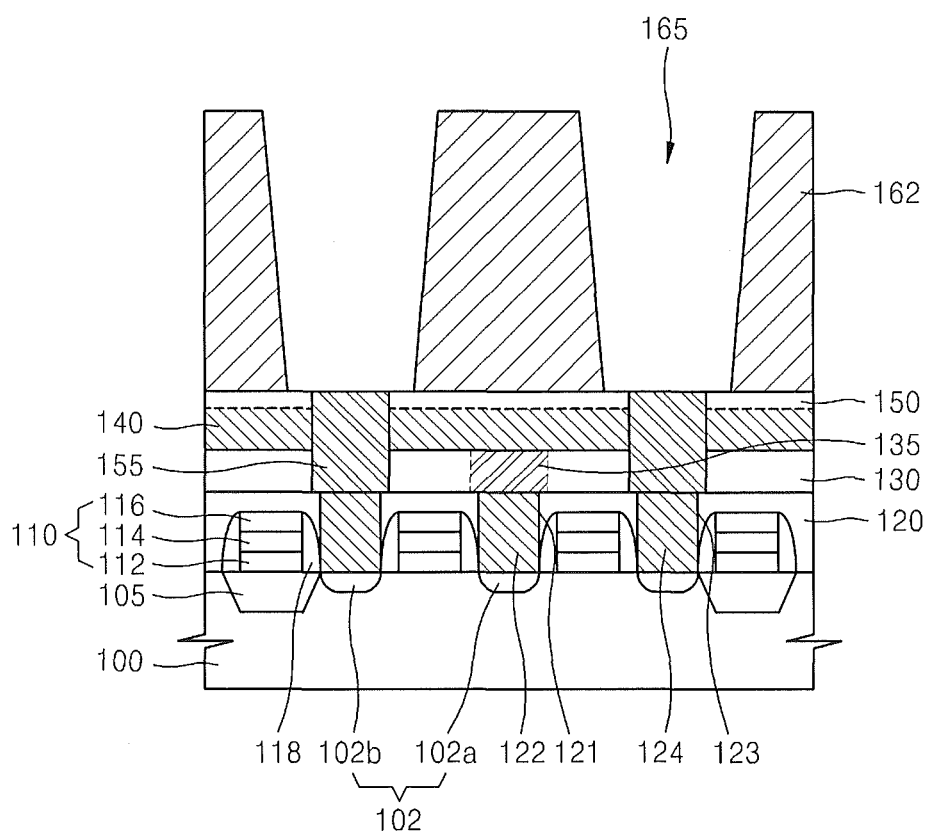

Referring to FIG. 3, a first upper electrode layer (not shown) is formed on the capacitor contacts 155 and the third insulating interlayer 150. Fourth openings 165 are formed through the first upper electrode layer to expose the capacitor contacts 155 and portions of the upper surface of the third insulating interlayer 150 which are adjacent the capacitor contacts 155. Thus, a first upper electrode 162, including the fourth openings 165, is formed on the third insulating interlayer 150.

In exemplary embodiments, the first upper electrode layer may be formed of a conductive material such as doped polysilicon, doped silicon-germanium, metal, or metal nitride by a CVD process or an ALD process. Since dielectric layer patterns and lower electrodes are formed on lateral walls of the first upper electrode 162 that are exposed through the fourth openings 165 in subsequent process steps, the first upper electrode 162 may serve as a mold layer for forming a lower electrode.

Before the first upper electrode layer is formed, an etch stop layer (not shown) may be further formed on the third insulating interlayer 150. The etch stop layer may be formed of a material having an etch selectivity with respect to the third insulating interlayer 150.

Figure 4:
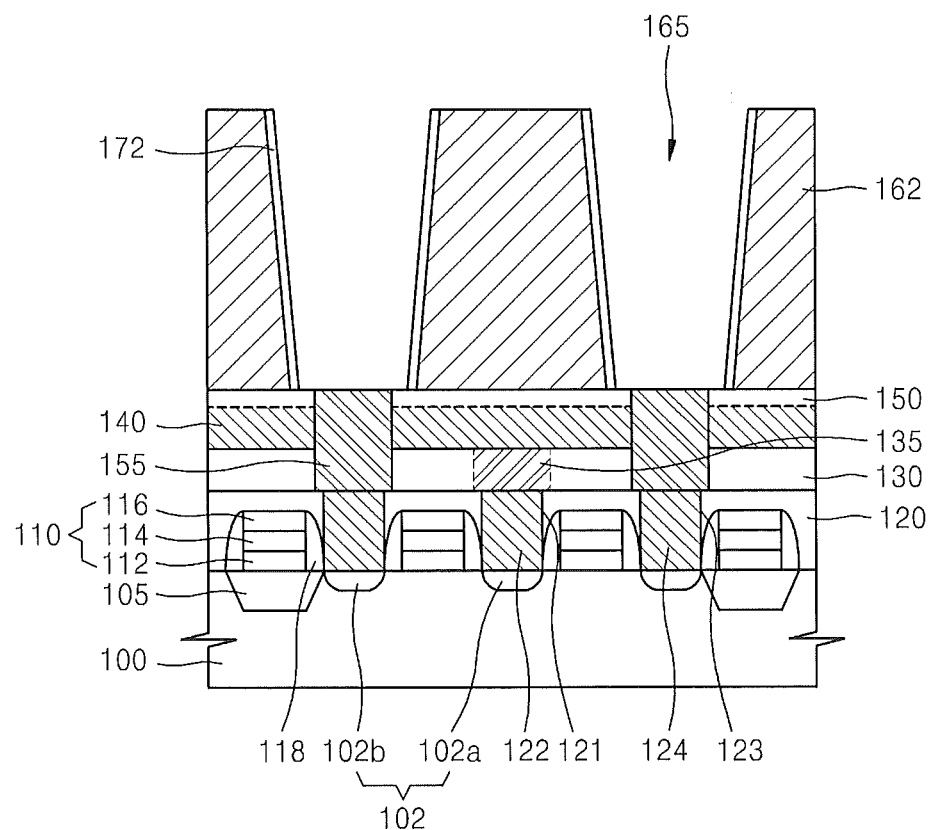

Referring to FIG. 4, first dielectric layer patterns 172 are formed on the lateral walls of the first upper electrode 162 that are exposed through the fourth openings 165. In exemplary embodiments, the first dielectric patterns 172 may be formed by conformally forming a first dielectric layer (not shown) on the first upper electrode 162 along an inner wall of the fourth openings 165. An anisotropic etching process may then be performed on the first dielectric layer to form the first dielectric layer patterns 172 on the inner wall of the fourth openings 165. The portion of the first dielectric layer that was formed on a bottom portion of the fourth openings 165 is removed by the anisotropic etching process so as to expose upper surfaces of the capacitor contacts 155 and portions of the upper surfaces of the third insulating interlayer 150.

In exemplary embodiments, the first dielectric layer may be formed of silicon oxide, silicon nitride, hafnium oxide, aluminum oxide, lanthanum oxide, yttrium oxide, lanthanum aluminum oxide, and tantalum oxide, which may be used alone or in a combination of one or more thereof. The first dielectric layer may be formed by a CVD process, an ALD process, or the like.

The first dielectric layer patterns 172 may be formed on the entirety of the lateral walls of the first upper electrode 162 that are exposed through the fourth openings 165 so as to serve as a dielectric layer formed between the first upper electrode 162 and lower electrodes that are formed in a subsequent process.

Figure 5:
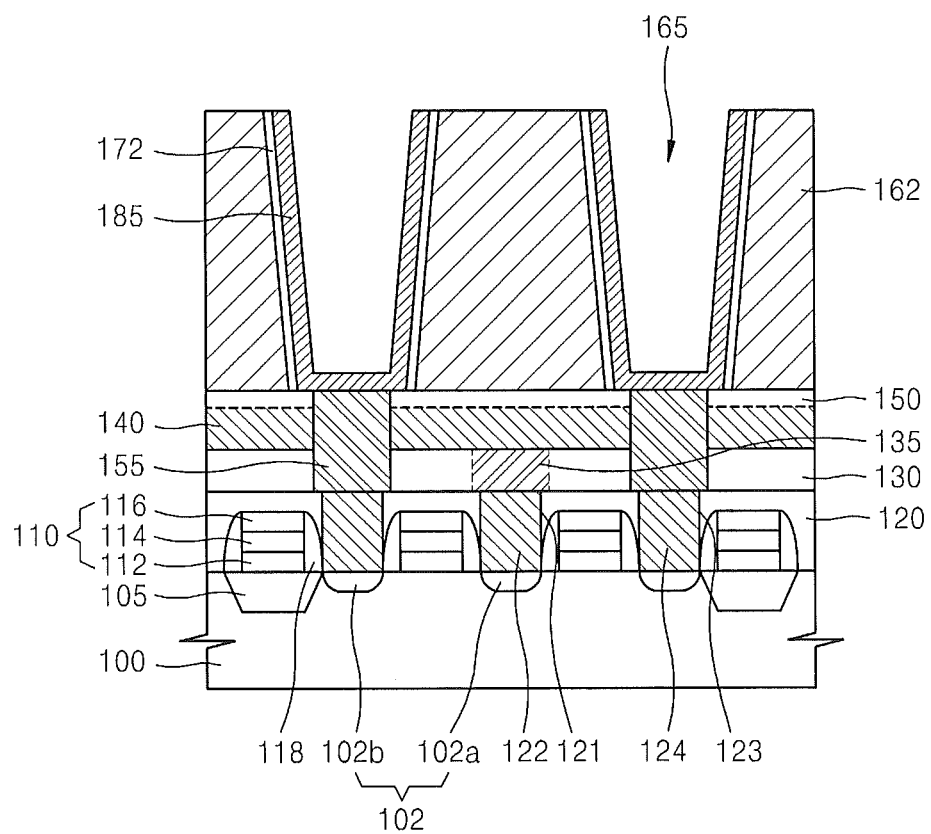

Referring to FIG. 5, a lower electrode layer (not shown) is formed on portions of the capacitor contacts 155, the portions of the third insulating interlayer 150 that are exposed through the fourth openings 165, the first dielectric layer patterns 172, and the first upper electrode 162. Then, portions of the lower electrode layer covering an upper surface of the first upper electrode 162 are removed to form lower electrodes 185 on inner walls of the fourth openings 165 and on the capacitor contacts 155.

In exemplary embodiments, the lower electrodes 185 may each have a cup shape or a cylinder shape with a closed bottom. In addition, horizontal sectional views of the lower electrodes 185 (i.e., sectional views taken in planes that are parallel to the top surface of the substrate 100) may each have various shapes such as a circular shape, an oval shape, and a polygonal shape.

In exemplary embodiments, the lower electrode layer may be formed of tungsten (W), titanium (Ti), tantalum (Ta), molybdenum (Mo), iridium (Ir), hafnium (Hf), zirconium (Zr), ruthenium (Ru), platinum (Pt), nickel (Ni), aluminum (Al), copper (Cu), tungsten oxide, aluminum oxide, tantalum oxide, titanium nitride, molybdenum nitride, hafnium nitride, zirconium nitride, polysilicon doped with impurities, or the like. The lower electrode layer may be formed, for example, by a CVD process, an ALD process or a sputtering process.

In exemplary embodiments, a sacrificial layer (not shown) is formed on the lower electrode layer so as to fill the fourth openings 165, and then the lower electrode layer is planarized to expose an upper surface of the first upper electrode 162 to form the lower electrodes 185 in the fourth openings 165. The planarization may be performed by an etch-back process, a chemical mechanical polishing (CMP) process, or the like. Then, the sacrificial layer may be removed.

In other exemplary embodiments, the lower electrodes 185 may be formed by using an etch-back process without forming the sacrificial layer. If the fourth openings 165 each have a narrow width, the lower electrode layer may fill the fourth openings 165 during formation of the lower electrode layer. In this case, a portion of the lower electrode layer that is formed on a bottom portion of each of the fourth openings 165 may have a thickness that is greater than a thickness of a portion of the lower electrode layer that is formed on an upper surface of the first upper electrode 162. Thus, when an etch-back process is performed until the upper surface of the first upper electrode 162 is exposed, a portion of the lower electrode layer that is formed in the bottom portion of each of the fourth openings 165 may remain. That is, when an etch-back process is performed until only portions of the lower electrode layer formed on the lateral walls and the bottom portion of each of the fourth openings 165 remain, the lower electrodes 185 may be respectively formed on the bottom portions and the lateral walls of the fourth openings 165.

Bottom surfaces of the lower electrodes 185 may directly contact the capacitor contacts 155. In addition, the lateral walls of the first upper electrode 162 that are exposed through the fourth openings 165 are surrounded by the first dielectric layer patterns 172 so that the first upper electrode 162 does not directly contact the lower electrodes 185 (i.e., the first dielectric layer patterns insulate the first upper electrode 162 from the lower electrode 185). In exemplary embodiments, an uppermost surface of each of the lower electrodes 185 may be substantially coplanar with an uppermost surface of each of the first dielectric layer patterns 172. In other embodiments, the uppermost surface of each of the lower electrodes 185 may have a level lower than that of the uppermost surface of each of the first dielectric layer patterns 172.

Figure 6:
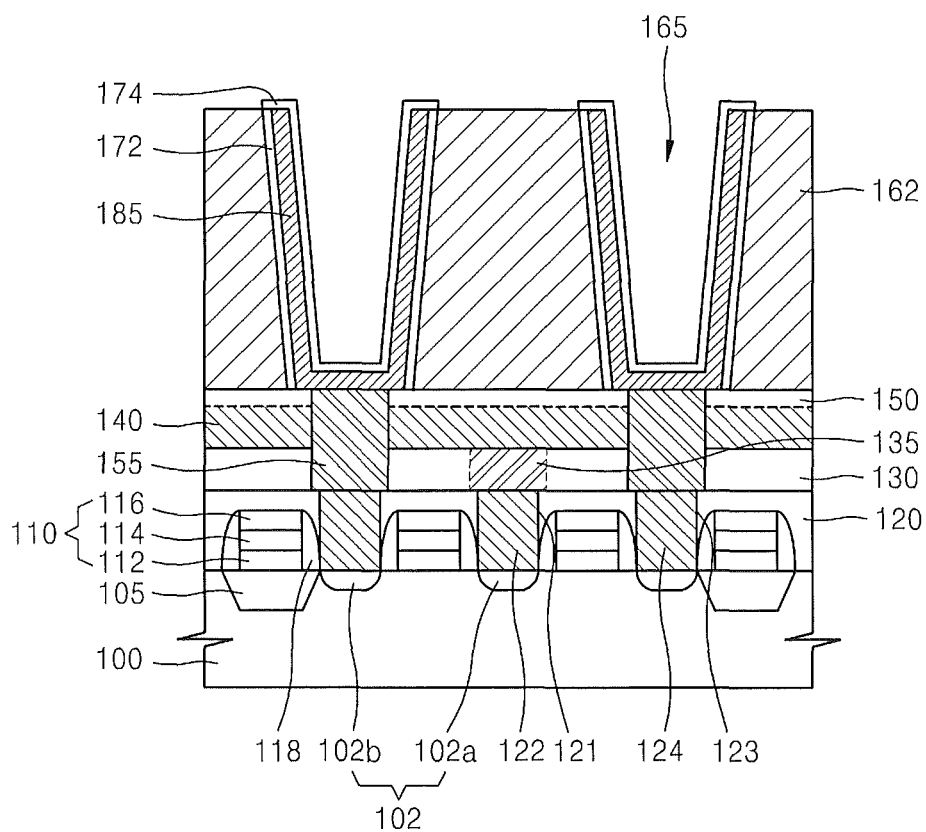

Referring to FIG. 6, second dielectric layer patterns 174 are formed on the lower electrodes 185 and the first dielectric layer patterns 172. The second dielectric layer patterns 174 are formed to have a predetermined thickness so as not to fill the fourth openings 165 and are respectively connected to the first dielectric layer patterns 172 so as to surround the lower electrodes 185.

In exemplary embodiments, the second dielectric layer patterns 174 may be formed by forming a second dielectric layer (not shown) on the lower electrodes 185, the first dielectric layer patterns 172, and the first upper electrode 162 and then removing portions of the second dielectric layer that are formed on the first upper electrode 162. The second dielectric layer may be formed, for example, of silicon oxide, silicon nitride, hafnium oxide, aluminum oxide, lanthanum oxide, yttrium oxide, lanthanum aluminum oxide, and tantalum oxide, which may be used alone or in a combination of one or more thereof. The second dielectric layer may be formed by a CVD process, an ALD process, or the like. In exemplary embodiments, the second dielectric layer may be formed of substantially the same material as the first dielectric layer patterns 172. In other embodiments, the second dielectric layer may be formed of a different material from the first dielectric layer patterns 172.

Outlines of upper surfaces of the second dielectric layer patterns 174 may correspond to outlines of the fourth openings 165 formed in the first upper electrode 162.

Figure 7:
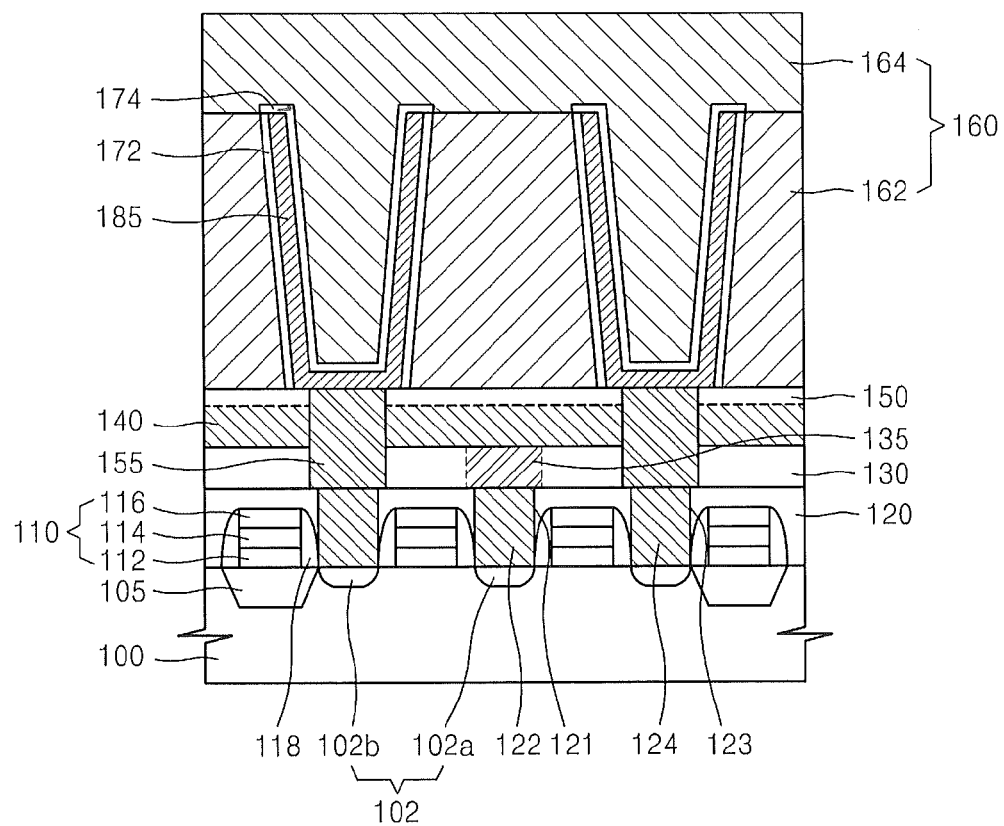

Referring to FIG. 7, a second upper electrode 164 may be formed on the first upper electrode 162 and the second dielectric layer patterns 174 to fill and cover the fourth openings 165. In exemplary embodiments, the second upper electrode 164 may be formed of a conductive material such as doped polysilicon, doped silicon-germanium, metal, or metal nitride by a CVD process or an ALD process. In exemplary embodiments, the second upper electrode 164 may be formed of substantially the same material as the first upper electrode 162.

The first dielectric layer patterns 172 and the second dielectric layer patterns 174 are connected to each other to surround the lower electrodes 185. The first upper electrode 162 and the second upper electrode 164 are connected to each other to surround the first dielectric layer patterns 172 and the second dielectric layer patterns 174. Thus, the first dielectric layer patterns 172, the second dielectric layer patterns 174, the lower electrodes 185, and an upper electrode 160 including the first upper electrode 162 and the second upper electrode 164 may constitute a capacitor.

The semiconductor device may be manufactured by performing the above-described processes.

According to the exemplary embodiments, the first upper electrode 162 having the fourth openings 165 is formed, and the first dielectric layer patterns 172 are formed on the lateral walls of the first upper electrode 162 that are exposed through the fourth openings 165. Then, the lower electrodes 185 are formed on inner walls of the first dielectric layer patterns 172 and the fourth openings 165, and the second dielectric layer patterns 174 that are connected to the first dielectric layer patterns 172 are formed on the lower electrodes 185. Then, the second upper electrode 164 is formed on the second dielectric layer patterns 174 and the first upper electrode 162. Since the first and second dielectric layer patterns 172 and 174 and the lower electrodes 185 are formed by using the first upper electrode 162 as a mold layer, the likelihood that the lower electrode 185 of the capacitor collapses is reduced or prevented even if the lower electrode 185 has a high aspect ratio.

Figure 8:
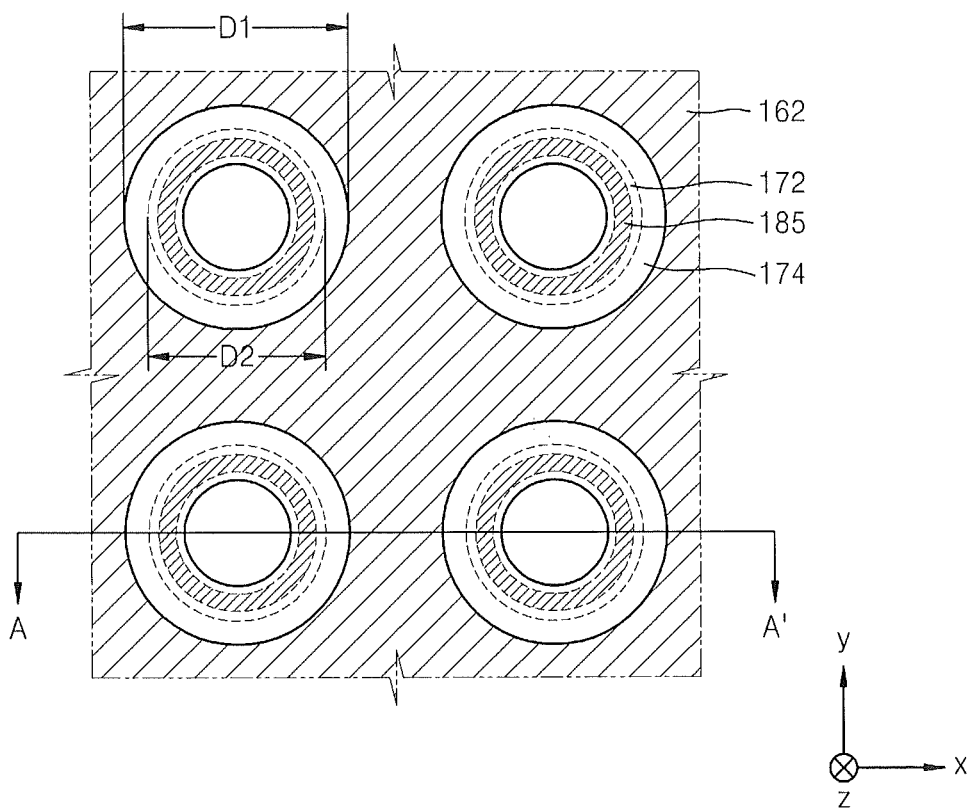
FIG. 8 is a plan view that illustrates a method of manufacturing a semiconductor device according to an exemplary embodiment of the inventive concept.
Figure 9:
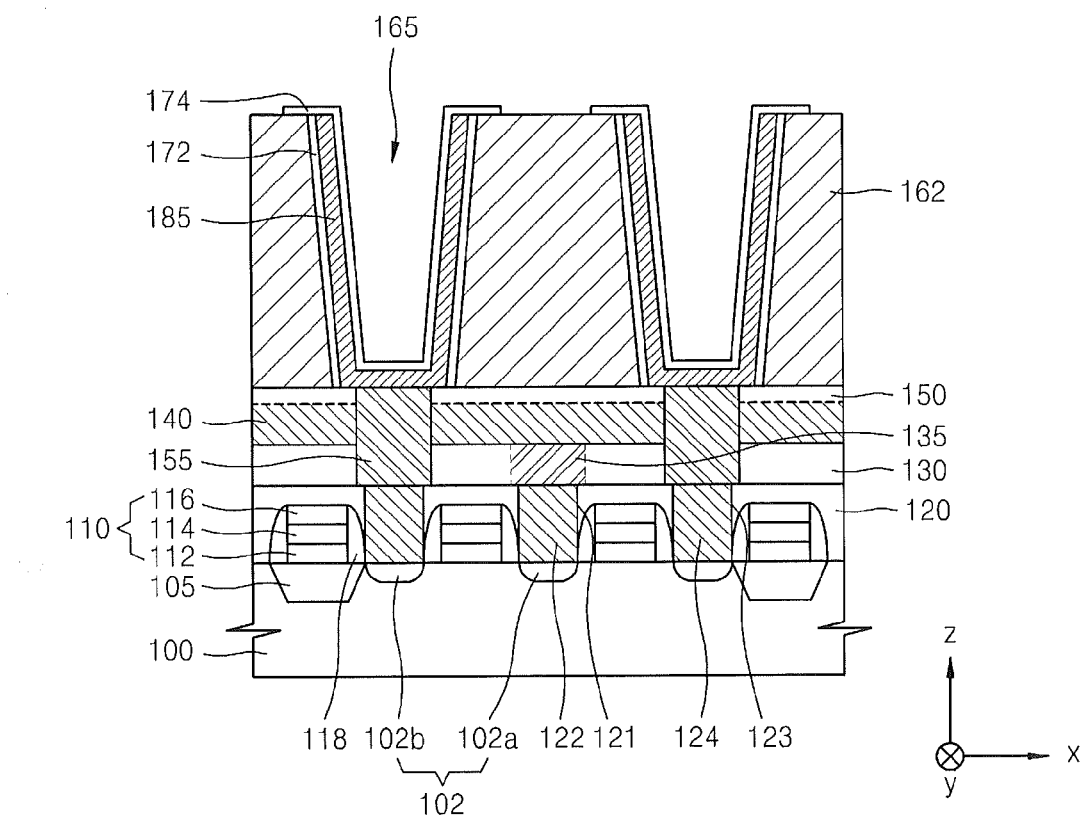
FIG. 9 is a cross-sectional view taken along the line A-A' of FIG. 8.

FIG. 8 is a plan view illustrating a method of manufacturing a semiconductor device according to an exemplary embodiment of the inventive concept. FIG. 9 is a cross-sectional view taken along the line A-A' of FIG. 8. The method of manufacturing the semiconductor device illustrated in FIGS. 8 and 9 is substantially the same as the method of manufacturing the semiconductor device described with reference to FIGS. 1 through 7, except for the shapes of the second dielectric layer patterns 174 and thus will be described in terms of its differences from the method described with reference to FIGS. 1 through 7.

The processes described with reference to FIGS. 1 through 5 are performed. That is, the first upper electrode 162 having the fourth openings 165 is formed on the substrate 100 and the first dielectric layer patterns 172 are formed on lateral walls of the first upper electrode 162 that are exposed through the fourth openings 165. Then, the lower electrodes 185 are formed on inner walls of the first dielectric layer patterns 172 and on the bottom of the fourth openings 165.

Referring to FIGS. 8 and 9, a second dielectric layer (not shown) is formed on the first upper electrode 162 so as to cover inner walls of the fourth openings 165, and the second dielectric layer is patterned to form the second dielectric layer patterns 174 that cover the inner walls of the fourth openings 165. The second dielectric layer patterns 174 are connected to the first dielectric layer patterns 172. Portions of the second dielectric layer patterns 174 cover portions of an upper surface of the first upper electrode 162.

In exemplary embodiments, the fourth openings 165 may each have a horizontal sectional view that is a substantially circular shape. Upper surfaces of the second dielectric layer patterns 174 may also each have a substantially circular shape so as to correspond to shapes of the fourth openings 165. In other embodiments, horizontal sectional views of the fourth openings 165 may each have various shapes such as an oval shape, and a polygonal shape. Upper surfaces of the second dielectric layer patterns 174 may each have various shapes so as to correspond to shapes of the fourth openings 165.

In exemplary embodiments, a first width D1 of the upper surface of each of the second dielectric layer patterns 174 may be substantially greater than a second width D2 of an outer surface of each of the first dielectric layer patterns 172. That is, the first width D1 of the upper surface of each of the second dielectric layer patterns 174 is substantially greater than a width of each of the fourth openings 165 formed in the first upper electrode 162 such that edge portions of the second dielectric layer patterns 174 may be formed on the first upper electrode 162. Accordingly, even if misalignment occurs in a process of patterning the second dielectric layer patterns 174, the first dielectric layer patterns 172 and the second dielectric layer patterns 174 may still overlap. Therefore, short circuits between the lower electrodes 185 and a second upper electrode (not shown) that is formed in a subsequent process, which may occur if the lower electrodes 185 are not sufficiently surrounded by the first dielectric layer patterns 172 and the second dielectric layer patterns 174, may be avoided.

Then, the second upper electrode (not shown in FIGS. 8-9, but see FIG. 7) may be formed on the second dielectric layer patterns 174 and the first upper electrode 162. In exemplary embodiments, the second upper electrode may be formed of substantially the same material as the first upper electrode 162.

Figure 10:
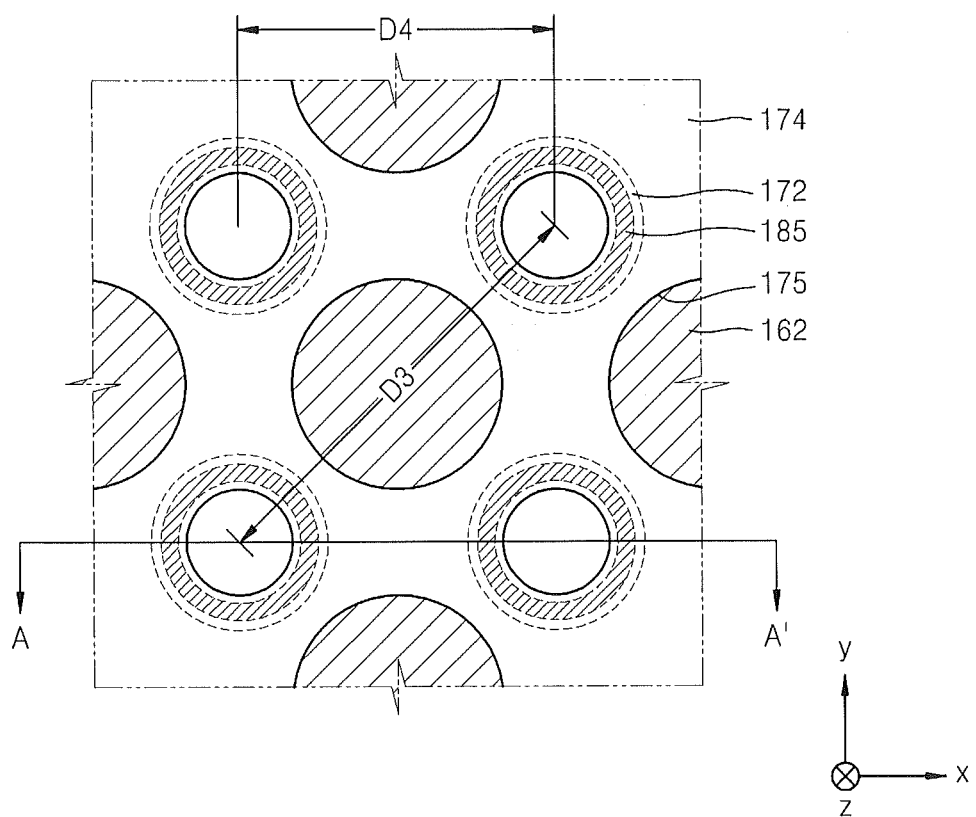
FIG. 10 is a plan view that illustrates explaining a method of manufacturing a semiconductor device according to another exemplary embodiment of the inventive concept.
Figure 11:
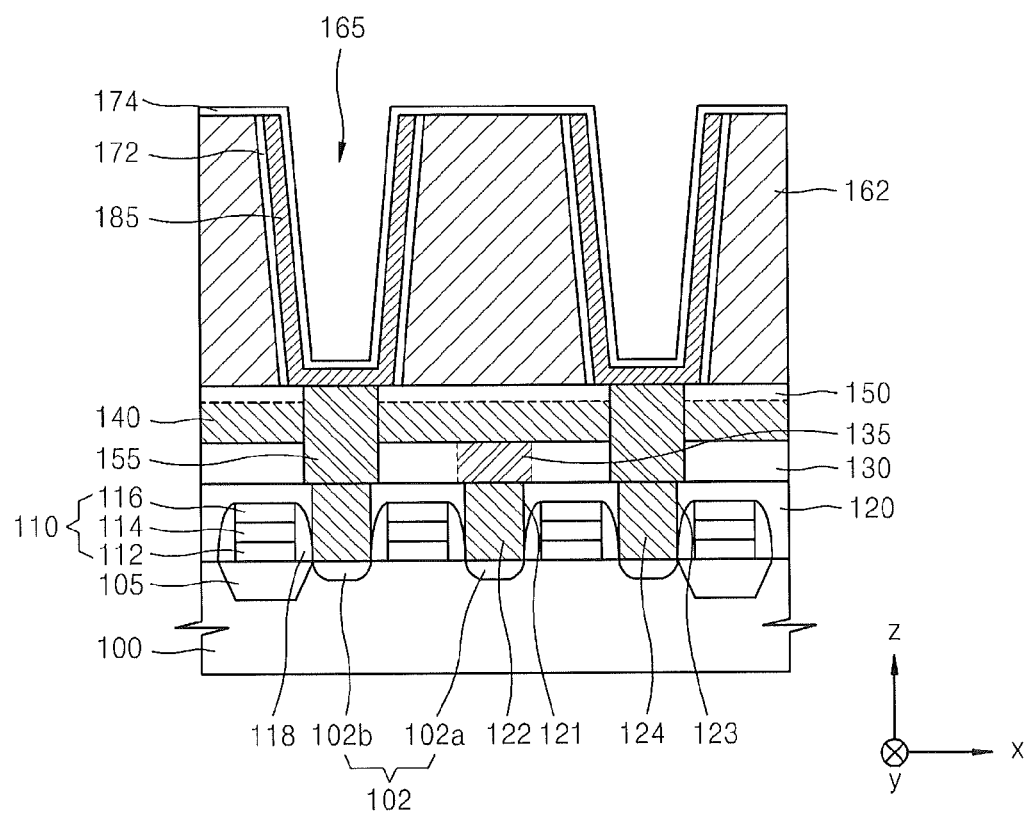
FIG. 11 is a cross-sectional view taken along the line A-A' of FIG. 10.

FIG. 10 is a plan view illustrating a method of manufacturing a semiconductor device according to another exemplary embodiment of the inventive concept. FIG. 11 is a cross-sectional view taken along a line A-A' of FIG. 10. The method of manufacturing the semiconductor device illustrated in FIGS. 10 and 11 is substantially the same as the method of manufacturing the semiconductor device described with reference to FIGS. 1 through 7, except for the shapes of the second dielectric layer patterns 174, and thus will be described in terms of its differences from the method described with reference to FIGS. 1 through 7.

The processes described with reference to FIGS. 1 through 5 are performed. That is, the first upper electrode 162 having the fourth openings 165 is formed on the substrate 100 and the first dielectric layer patterns 172 are formed on lateral walls of the first upper electrode 162 that are exposed through the fourth openings 165. Then, the lower electrodes 185 are formed on inner walls of the first dielectric layer patterns 172 and on the bottom of the fourth openings 165.

Referring to FIGS. 10 and 11, a second dielectric layer (not shown) is formed on the lower electrodes 185, the first dielectric layer patterns 172, and the first upper electrode 162. A plurality of holes 175 are formed in the second dielectric layer that expose an upper surface of the first upper electrode 162 to form the second dielectric layer patterns 174. The second dielectric layer patterns 174 are formed on entire surfaces of the lower electrodes 185 formed in the fourth openings 165 and the first upper electrode 162. The second dielectric layer patterns 174 may comprise a single, continuous pattern.

In exemplary embodiments, when the lower electrodes 185 are spaced apart from each other in a first direction (the x-axis direction of FIG. 10) and in a second direction (the y-axis direction of FIG. 10) that is perpendicular to the first direction, a first interval D3 between two lower electrodes 185 that are adjacent in a diagonal direction between the first and second directions is substantially greater than a second interval D4 between two lower electrodes 185 that are adjacent in the first direction. Thus, the holes 175 may be formed by patterning a region between the two lower electrodes 185 that are adjacent in the diagonal direction.

Then, a second upper electrode (not shown in FIGS. 10 and 11) may be formed on the first upper electrode 162 and the second dielectric layer patterns 174. The second upper electrode may contact portions of an upper surface of the first upper electrode 162 that is exposed through the holes 175. The second upper electrode and the first upper electrode 162 may be electrically connected to each other so as to serve as an upper electrode of a capacitor.

Figure 12:
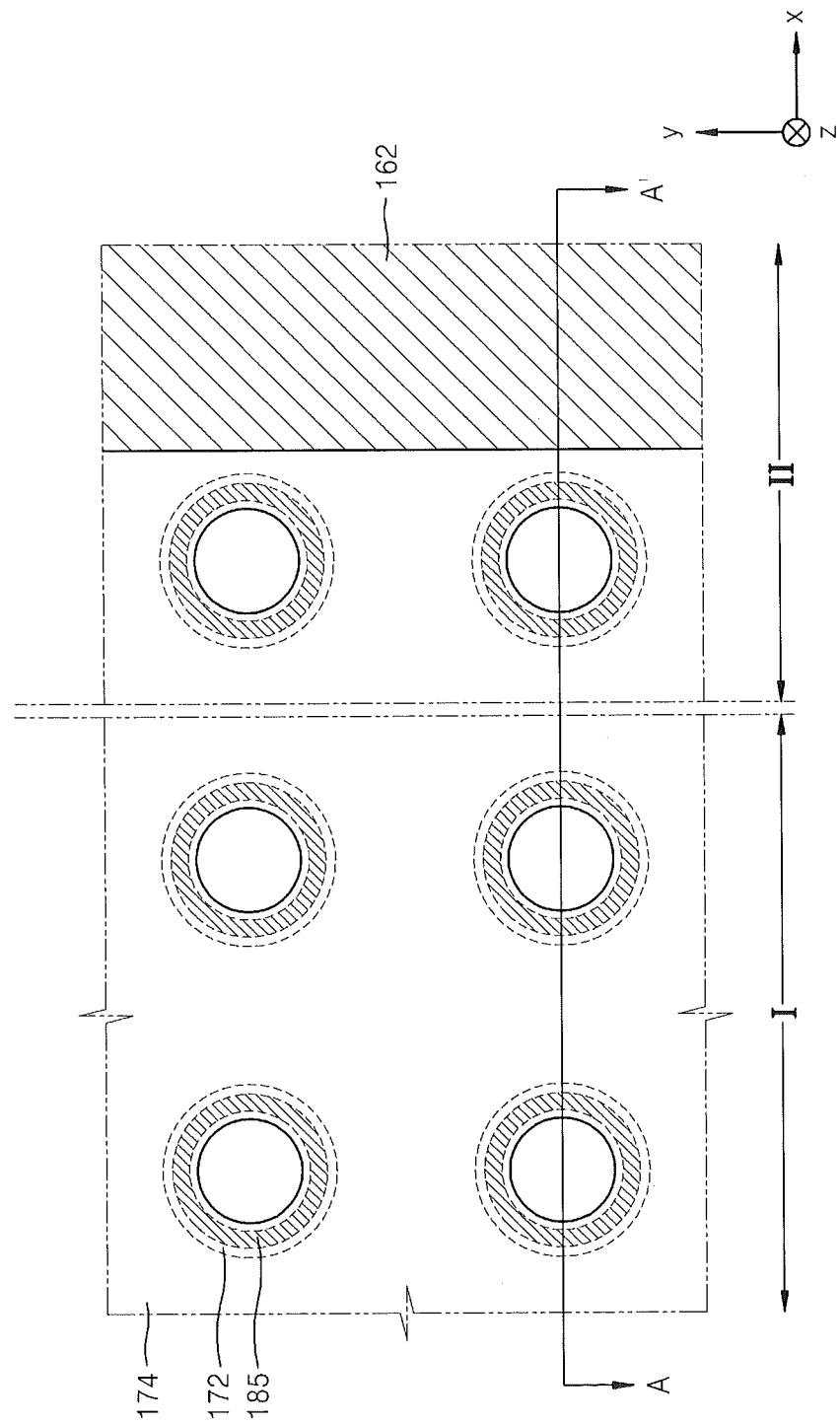
FIG. 12 is a plan view that illustrates a method of manufacturing a semiconductor device according to another exemplary embodiment of the inventive concept.
Figure 13:
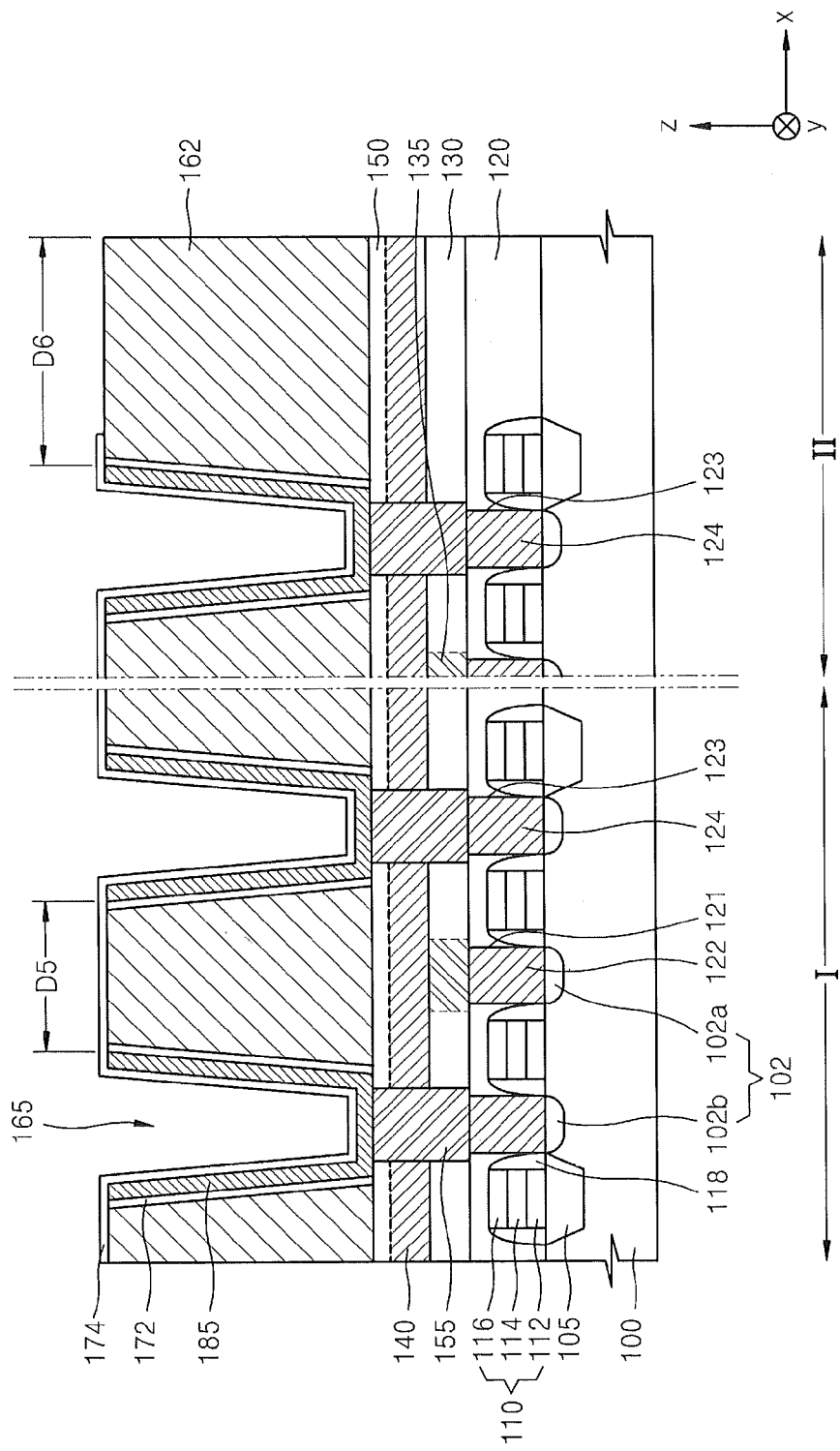
FIG. 13 is a cross-sectional view taken along the line A-A' of FIG. 12.

FIG. 12 is a plan view illustrating a method of manufacturing a semiconductor device according to another exemplary embodiment of the inventive concept. FIG. 13 is a cross-sectional view taken along the line A-A' of FIG. 12. The method of manufacturing the semiconductor device illustrated in FIGS. 12 and 13 is substantially the same or similar to the method of manufacturing the semiconductor device described with reference to FIGS. 1 through 7, except for the shapes of the second dielectric layer patterns 174, and thus will be described in terms of its differences from the method described with reference to FIGS. 1 through 7.

The processes described with reference to FIGS. 1 through 5 are performed. That is, the first upper electrode 162 having the fourth openings 165 is formed on the substrate 100 and the first dielectric layer patterns 172 are formed on lateral walls of the first upper electrode 162, which are exposed through the fourth openings 165. Then, the lower electrodes 185 are formed on inner walls of the first dielectric layer patterns 172 and the fourth openings 165.

Referring to FIGS. 12 and 13, a second dielectric layer (not shown) may be formed on the lower electrodes 185, the first dielectric layer patterns 172, and the first upper electrode 162. Then, portions of the second dielectric layer which are formed on an edge portion of the first upper electrode 162 are removed to form the second dielectric layer patterns 174.

The second dielectric layer patterns 174 may be formed on the lower electrodes 185 that are formed in the fourth openings 165 and the first upper electrode 162 so as to be connected to each other (i.e., the second dielectric layer patterns 174 may be a single continuous pattern). Portions of the second dielectric layer which are formed on the edge portion of the first upper electrode 162 are removed to expose an upper surface of the edge portion of the first upper electrode 162.

A third interval D5 (see FIG. 13) that is between the lower electrodes 185 formed in a cell region I may be relatively narrow. On the other hand, a fourth interval D6 (see FIG. 13) from an external lateral portion formed at an outermost portion of the lower electrodes 185 formed in a cell region edge II to an outer edge of the first upper electrode 162 may be relatively wide. Thus, portions of the second dielectric layer, which is formed from the external lateral portion formed at the outermost portion of the lower electrodes 185 to the outer edge of the first upper electrode 162, may be removed to expose portions of an upper surface of an edge portion of the first upper electrode 162. In this case, when an interval between adjacent lower electrodes 185 is small, misalign failure that may occur in a process of patterning the second dielectric layer patterns 174 may be reduced or prevented.

Then, a second upper electrode (not shown in FIGS. 12 and 13) is formed on the exposed portions of the upper surface of the edge portion of the first upper electrode 162 and the second dielectric layer patterns 174 so as to fill the fourth openings 165. The first upper electrode 162 and the second upper electrode may be electrically connected to each other in the cell region edge II so as to serve as an upper electrode of a capacitor.

Figure 14:
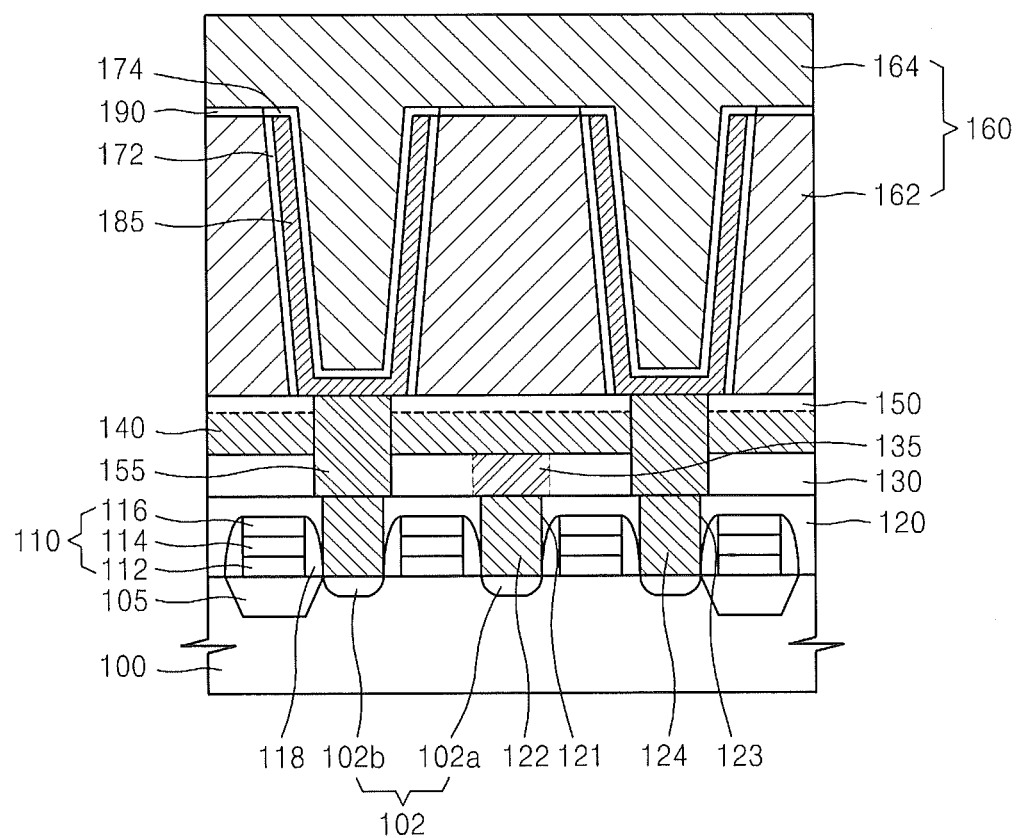
FIG. 14 is a cross-sectional view that illustrates a method of manufacturing a semiconductor device according to another exemplary embodiment of the inventive concept.

FIG. 14 is a cross-sectional view that illustrates a method of manufacturing a semiconductor device according to another exemplary embodiment of the inventive concept. The method of manufacturing the semiconductor device of FIG. 14 is substantially the same or similar to the method of manufacturing the semiconductor device described with reference to FIGS. 1 through 7, except that an ohmic layer 190 is further formed between the first upper electrode 162 and the second upper electrode 164 and thus will be described in terms of its differences from the method described with reference to FIGS. 1 through 7.

The processes described with reference to FIGS. 1 through 6 are performed. That is, the first upper electrode 162 having the fourth openings 165 is formed on the substrate 100, and the first dielectric layer patterns 172 are formed on lateral walls of the first upper electrode 162 that are exposed through the fourth openings 165. Then, the lower electrodes 185 are formed on inner walls of the first dielectric layer patterns 172 and on the bottom surface of the fourth openings 165. In addition, the second dielectric layer patterns 174 are formed on the lower electrodes 185 so as to be connected to the first dielectric layer patterns 172.

Referring to FIG. 14, the ohmic layer 190 is formed on the first upper electrode 162, and the second upper electrode 164 is formed on the ohmic layer 190 and the second dielectric layer patterns 174 to fill the fourth openings 165.

In exemplary embodiments, the ohmic layer 190 may be formed of metal silicide such as tantalum silicide, titanium silicide, tungsten silicide, molybdenum silicide, hafnium silicide, zirconium silicide, ruthenium silicide, nickel silicide, or the like. For example, when the first upper electrode 162 includes polysilicon, an ohmic metal layer (not shown) is formed on the first upper electrode 162 and thermal treatment is performed on the ohmic metal layer whereby the ohmic metal layer and an upper portion of the first upper electrode 162 may react with each other to form the ohmic layer 190. Then, the second upper electrode 164 is formed on the ohmic layer 190 and the second dielectric layer patterns 174.

In other exemplary embodiments, the second upper electrode 164 is formed on the first upper electrode 162 and the second dielectric layer patterns 174, and heat treatment is performed on the second upper electrode 164 to form the ohmic layer 190 in a portion where the first upper electrode 162 and the second upper electrode 164 contact each other. When the first upper electrode 162 includes doped polysilicon and the second upper electrode 164 includes metal such as Ta, Ti, or the like, the ohmic layer 190 may be formed to include metal silicide such as tantalum silicide, titanium silicide, or the like.

The ohmic layer 190 may be formed between the first upper electrode 162 and the second upper electrode 164, thereby preventing a decrease in electrical conductivity, which may occur if the first upper electrode 162 and the second upper electrode 164 are formed of different materials.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a first upper electrode on an insulating interlayer through which a capacitor contact is interposed, the first upper electrode having an opening that exposes the capacitor contact;
    forming a first dielectric layer pattern on an inner wall of the first upper electrode that at least partly defines the opening;
    forming a lower electrode on the first dielectric layer pattern and on the capacitor contact;
    forming a second dielectric layer pattern on the lower electrode and on the first dielectric layer pattern, wherein at least a portion of the second dielectric layer pattern is within the opening; and
    forming a second upper electrode on a portion of the second dielectric layer pattern and on the first upper electrode, wherein the portion of the second dielectric layer pattern is within the opening, and the second upper electrode contacts the first upper electrode.

2. The method of claim 1, wherein the first upper electrode is formed of doped polysilicon, silicon-germanium, metal, or metal nitride, and wherein the second upper electrode is formed of doped polysilicon, silicon-germanium, metal, or metal nitride.

3. The method of claim 1, wherein forming the first dielectric layer pattern comprises:
    forming a first dielectric layer that at least partially fills the opening; and
    anisotropically etching the first dielectric layer to form the first dielectric layer pattern on the inner wall of the first upper electrode.

4. The method of claim 3, wherein forming the lower electrode comprises:
    forming a lower electrode layer on the capacitor contact, the first dielectric layer pattern, and the first upper electrode; and
    planarizing the lower electrode layer to expose upper surfaces of the first dielectric layer pattern and the first upper electrode to form the lower electrode directly on the capacitor contact and on the first dielectric layer pattern.

5. The method of claim 4, wherein forming the second dielectric layer pattern comprises:
    forming a second dielectric layer on the lower electrode, the upper surface of the first dielectric layer pattern, and the first upper electrode; and
    removing a portion of the second dielectric layer that is formed on the first upper electrode so as to expose a portion of the upper surface of the first upper electrode.

6. The method of claim 5, wherein the second upper electrode directly contacts the portion of the upper surface of the first upper electrode exposed through the second dielectric layer.

7. The method of claim 5, further comprising forming an ohmic pattern directly contacting the portion of the upper surface of the first upper electrode exposed through the second dielectric layer prior to forming the second upper electrode.

8. The method of claim 5, wherein:
    the capacitor contact is one of a plurality of capacitor contacts in the insulating interlayer;
    the opening is one of a plurality of openings in the first upper electrode, wherein each of the plurality of the openings exposes respective ones of the plurality of capacitor contacts;
    forming the lower electrode comprises forming a plurality of lower electrodes, which are respectively formed in the plurality of openings; and
    removing the portion of the second dielectric layer comprises forming a plurality of holes through the second dielectric layer that expose respective portions the upper surface of the first upper electrode,
    wherein the plurality of lower electrodes are spaced apart from each other in a first direction and in a second direction that is perpendicular to the first direction, and
    wherein the plurality of holes are respectively formed in regions between two of the plurality of lower electrodes that are adjacent in a diagonal direction between the first direction and the second direction.

9. The method of claim 8, wherein the second upper electrode directly contacts the portions of the upper surface of the first upper electrode that are exposed through the plurality of holes.

10. The method of claim 9, further comprising forming a plurality of ohmic patterns, wherein each of the plurality of ohmic patterns directly contacts the respective portions of the upper surface of the first upper electrode that are exposed through the plurality of holes.

11. The method of claim 5, wherein:
removing the portion of the second dielectric layer is performed prior to forming the second upper electrode; and
forming the second upper electrode comprises forming the second upper electrode to directly contact the portion of the upper surface of the first upper electrode that is exposed by the second dielectric layer.

12. The method of claim 1, further comprising:
forming a gate electrode on a substrate;
forming a source/drain region in the substrate adjacent the gate electrode;
forming the insulating interlayer on the gate electrode; and
forming the capacitor contact to extend through the insulating interlayer, wherein the capacitor contact is in electrical contact with the source/drain region.

13. The method of claim 1, wherein forming the second dielectric layer pattern comprises:
forming a second dielectric layer on the lower electrode, the first dielectric layer pattern, and the first upper electrode; and
removing a portion of the second dielectric layer that is formed on an upper surface of the first upper electrode so as to expose a portion of the upper surface of the first upper electrode prior to forming the second upper electrode.

14. The method of claim 13, wherein forming the second upper electrode comprises forming the second upper electrode to directly contact the portion of the upper surface of the first upper electrode that is exposed by the second dielectric layer.

15. A method of manufacturing a semiconductor device, the method comprising:
forming a first layer on a substrate;
forming a first upper electrode on the first layer;
forming a plurality of openings in the first upper electrode;
forming a plurality of first dielectric layer patterns on respective sidewalls of the first upper electrode that are exposed through the plurality of openings;
forming a plurality of lower electrodes, within respective ones of the plurality of openings, on the plurality of first dielectric layer patterns and on the first layer;
forming a second dielectric layer pattern on the plurality of lower electrodes, the plurality of first dielectric layer patterns, and a portion of the first upper electrode; and
forming a second upper electrode on the first upper electrode and the second dielectric layer pattern, the second upper electrode being electrically connected to the first upper electrode,
wherein forming the second dielectric layer pattern comprises:
forming a second dielectric layer on the first upper electrode to cover the plurality of lower electrodes, which are respectively formed in the plurality of openings; and
removing a portion of the second dielectric layer formed on an edge portion of the first upper electrode to expose an upper surface of the edge portion of the first upper electrode.

16. The method of claim 15, wherein the first layer comprises an insulating interlayer through which a plurality of capacitor contacts are interposed, and wherein each of the plurality of openings exposes a respective one of the plurality of capacitor contacts, and wherein the second upper electrode extends into each of the plurality of openings.

17. The method of claim 15, wherein the second upper electrode is formed so as to directly contact either the exposed upper surface of the edge portion of the first upper electrode or an ohmic contact that is in direct contact with the exposed upper surface of the edge portion of the first upper electrode.

18. The method of claim 15, wherein forming the second upper electrode comprises forming the second upper electrode after removing the portion of the second dielectric layer.

19. The method of claim 18, wherein forming the second upper electrode comprises forming the second upper electrode to directly contact the upper surface of the edge portion of the first upper electrode that is exposed by the second dielectric layer.

* * * * *